(12) United States Patent
Nakamura et al.

(10) Patent No.: US 10,251,268 B2
(45) Date of Patent: Apr. 2, 2019

(54) CIRCUIT STRUCTURE

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Arinobu Nakamura, Mie (JP); Tou Chin, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/545,092

(22) PCT Filed: Jan. 13, 2016

(86) PCT No.: PCT/JP2016/050752
§ 371 (c)(1),
(2) Date: Jul. 20, 2017

(87) PCT Pub. No.: WO2016/125544
PCT Pub. Date: Aug. 11, 2016

(65) Prior Publication Data
US 2018/0020542 A1 Jan. 18, 2018

(30) Foreign Application Priority Data
Feb. 3, 2015 (JP) .................. 2015-019386

(51) Int. Cl.
*H05K 1/11* (2006.01)
*H05K 1/18* (2006.01)

(52) U.S. Cl.
CPC ................. *H05K 1/11* (2013.01); *H05K 1/18* (2013.01); *H05K 1/183* (2013.01); *H05K 2201/10166* (2013.01)

(58) Field of Classification Search
CPC ............. H05K 1/11; H05K 1/18; H05K 1/183
See application file for complete search history.

(56) References Cited

U.S. PATENT DOCUMENTS

| 6,984,133 | B2 * | 1/2006 | Naitou | ................... H05K 1/144 439/76.2 |
| 7,203,073 | B2 * | 4/2007 | Kawakita | ............. H05K 1/0263 361/775 |

(Continued)

FOREIGN PATENT DOCUMENTS

JP  H05-327167 A  12/1993
JP  H10-284821 A  10/1998

(Continued)

OTHER PUBLICATIONS

Search Report for Int'l. Appln. No. PCT/J02016/050752, dated Apr. 19, 2016, 3 pages including translation.

*Primary Examiner* — Nathan Milakovich
(74) *Attorney, Agent, or Firm* — Honigman LLP

(57) ABSTRACT

A circuit structure is provided to which an electronic component can be easily mounted (electrical connection of terminals). A circuit structure that includes a substrate provided with a conductive pattern on one face, a conductive member fixed to another face of the substrate, and an electronic component that has first terminals and, which are a portion of a plurality of terminals, electrically connected to the conductive member, and a terminal, which is a portion of the plurality of terminals, electrically connected to the conductive pattern provided on the substrate, wherein the (Continued)

conductive member has a shape in which at least a portion of the second terminal of the electronic component is not overlapped.

6 Claims, 12 Drawing Sheets

(56) References Cited

U.S. PATENT DOCUMENTS

| | | | | |
|---|---|---|---|---|
| 7,215,555 | B2* | 5/2007 | Takagi | H05K 1/029 |
| | | | | 361/600 |
| 7,863,724 | B2* | 1/2011 | Douriet | H01L 23/49827 |
| | | | | 257/691 |
| 8,138,428 | B2* | 3/2012 | Maeda | H01L 23/10 |
| | | | | 174/255 |
| 8,284,563 | B2* | 10/2012 | Hosokawa | H05K 7/20854 |
| | | | | 361/775 |
| 10,062,633 | B2* | 8/2018 | Hiratani | H01L 23/36 |
| 2008/0080151 | A1* | 4/2008 | Shimizu | H05K 1/0263 |
| | | | | 361/760 |
| 2017/0367189 | A1* | 12/2017 | Nakamura | H05K 1/183 |
| 2018/0310410 | A1* | 10/2018 | Nakamura | H01L 23/367 |

FOREIGN PATENT DOCUMENTS

| | | | |
|---|---|---|---|
| JP | 2000-151061 A | 5/2000 | |
| JP | 2003-164040 A | 6/2003 | |
| JP | 2012228082 A * | 11/2012 | |
| WO | WO-2017047383 A1 * | 3/2017 | ............ H02G 3/16 |

* cited by examiner

CIRCUIT STRUCTURE

CROSS-REFERENCE TO RELATED APPLICATIONS

This application is the U.S. national stage of PCT/JP2016/050752 filed Jan. 13, 2016, which claims priority of Japanese Patent Application No. JP 2015-019386 filed Feb. 3, 2015 and Japanese Patent Application No. JP 2015-170005 filed Aug. 31, 2015.

TECHNICAL FIELD

The present invention relates to a circuit structure that includes a substrate and a conductive member.

BACKGROUND

Circuit structures are known in which a conductive member that constitutes a circuit for conducting a comparatively large current is fixed to a substrate provided with a conductive pattern that constitutes a circuit for conducting a comparatively small current (for example, see JP 2003-164040A below).

In the circuit structure disclosed in JP 2003-164040A, a main portion of an electronic component (FET) is mounted on the conductive member, and at least one of the terminals of the main portion is connected to the conductive member while the other terminal or terminals are connected to the substrate (see FIG. 4 of JP 2003-164040A). Because there is a height difference (step difference), which corresponds to the thickness of the substrate, between a surface of the substrate and a surface of the conductive member, there is a need to perform processing such as bending of either of the terminals. Also, there may be cases where bending cannot be performed if the terminals are short, and connection becomes difficult.

The issue to be solved by the present invention is to provide a circuit structure to which an electronic component can be easily mounted (electrical connection of terminals).

SUMMARY

A circuit structure according to the present invention for solving the above problem includes a substrate provided with a conductive pattern on one face thereof, a conductive member fixed to the other face of the substrate; and an electronic component that has a first terminal electrically connected to the conductive member, and a second terminal electrically connected to the conductive pattern provided on the substrate, wherein the conductive member has a shape in which at least a portion of the second terminal of the electronic component is not overlapped thereby.

It is preferable that a first terminal connecting portion is provided on the other face of the substrate so as not to be overlapped by the conductive member, and the second terminal of the electronic component is electrically connected to the conductive pattern via the first terminal connecting portion.

It is preferable that a first lead member is further provided that electrically connects the second terminal of the electronic component and the terminal connecting portion.

It is preferable that a second terminal connecting portion is provided between the one face and the other face of the substrate, and is not overlapped by the conductive member, and the second terminal of the electronic component is electrically connected to the conductive pattern via the second terminal connecting portion.

It is preferable that a second lead member is further provided that electrically connects the second terminal of the electronic component and the second terminal connecting portion.

It is preferable that the second terminal connecting portion is formed along an inner circumferential surface of a through-hole formed in the substrate, and the second lead member has, on one side thereof, a contact terminal portion that is inserted into the through-hole and comes into contact with the second terminal connecting portion.

It is preferable that an opening is formed in the substrate, and the electronic component is mounted on the conductive member through the opening.

Advantageous Effects of Invention

The circuit structure according to the present invention is one in which the conductive member is shaped so as not to overlap at least a portion of the second terminal of the electronic component. Accordingly, the second terminal can be electrically connected to the conductive pattern provided on the substrate from the conductive member side, and the second terminal and the conductive pattern provided on the substrate can be electrically connected (connection work can be performed) to each other with ease.

If the first terminal connecting portion that is to be electrically connected to the second terminal is provided on the other face of the substrate so as not be overlapped by the conductive member, the second terminal and the substrate (circuit) can be electrically connected to each other by using the first terminal connecting portion.

The second terminal and the first terminal connecting portion can be connected to each other by using the first lead member, utilizing the fact that they are not overlapped by the conductive member.

If the second terminal connecting portion, to which the second terminal is electrically connected, is provided between the one face and the other face of the substrate so as not to be overlapped by the conductive member, the second terminal and the substrate (circuit) can be electrically connected to each other by using the second terminal connecting portion.

The second terminal and the second terminal connecting portion can be connected to each other by using the second lead member, utilizing the fact that they are not overlapped by the conductive member.

In the case where a structure is employed in which the second terminal connecting portion is formed along an inner circumferential surface of a through-hole formed in the substrate, the work of electrically connecting the second terminal and the substrate (circuit) to each other can be performed with ease by using the second lead member, which has a contact terminal portion that comes into contact with the second terminal connecting portion, while inserted into the through-hole.

Assuming a structure where the electronic component is mounted on the conductive member, the first terminals and the conductive member can be connected (connection work can be performed) with ease.

DETAILED DESCRIPTION OF PREFERRED EMBODIMENTS

Figure 1:
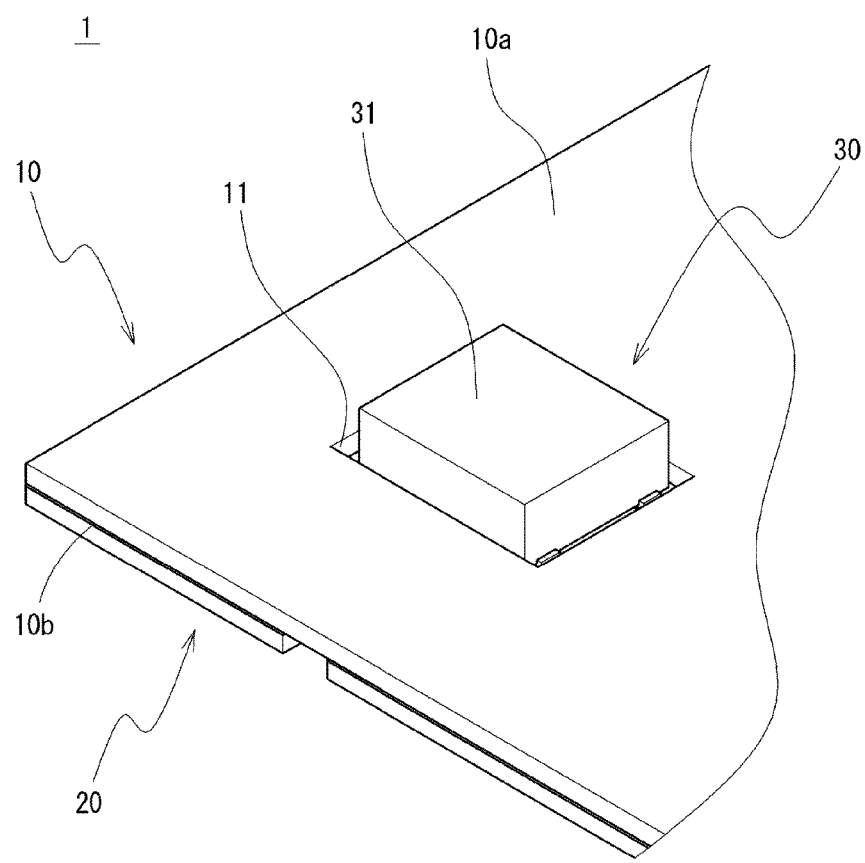
FIG. 1 is an external view of a circuit structure according to an embodiment of the present invention, and is an enlargement of a portion where an electronic component (transistor) is mounted.
Figure 2:
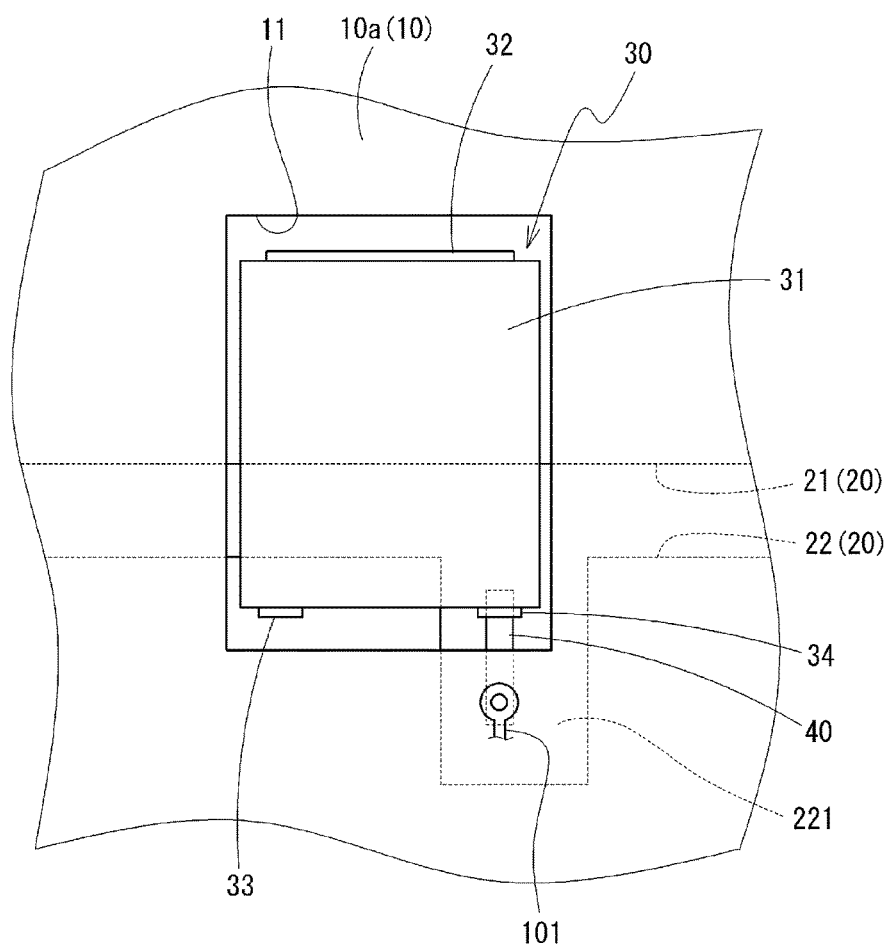
FIG. 2 is a plan view of the portion of the circuit structure where the electronic component is mounted (seen from substrate side).

Embodiments of the present invention will be described below in detail with reference to the drawings. Note that, unless indicated otherwise, "surface direction" in the following description refers to the surface direction of a substrate 10 and a conductive member 20, and "height direction" (up-down direction) refers to a direction that is orthogonal to the surface direction (taking the side of the substrate 10 in which an electronic component 30 is mounted as the upper side). Note that these directions do not limit the orientation in which a circuit structure 1 can be installed.

The circuit structure 1 according to the embodiment of the present invention shown in FIGS. 1 to 5 includes the substrate 10, the conductive member 20, and the electronic component 30. The substrate 10 is a substrate provided with a conductive pattern 101 on one face 10a (upper face) thereof (to facilitate comprehension of the drawings, a portion (portion where a later-described first lead member 40 is connected) is only shown in FIG. 2 and FIG. 5, and is omitted from the other drawings). The conductive path formed by the conductive pattern 101 is part of a control circuit, and the current that flows therethrough is relatively small compared to that which flows through the conductive path constituted by the conductive member 20.

The conductive member 20 is a plate-shaped portion fixed to the other face 10b (lower face) of the substrate 10. The conductive member 20 is formed into a predetermined shape through processing such as stamping, and constitutes a conductive path for power, the conductive path being a portion through which a relatively large (larger than the current flowing through the conductive path formed by the conductive pattern 101) current flows. The conductive member 20 is also referred to as a bus bar (bus bar plate), for example. The conductive member 20 is fixed to the other face 10b of the substrate 10 via an insulating adhesive agent or an adhesive sheet, for example. Thus, the substrate 10 and the conductive member 20 are one unit. Note that a heat dissipating member (e.g. a plate provided with fins) may be fixed to the bottom side (side opposite to substrate 10 side) of the conductive member 20. If the heat dissipating member is made of a conductive material, the conductive member 20 and the heat dissipating member are insulated from each other. A configuration may also be employed where no heat dissipating member is provided, and at least a portion of the conductive member 20 is exposed to the outside and the conductive member 20 itself has the function of dissipating heat.

The electronic component 30 is an element mounted in the substrate 10 and has a main portion 31 and terminals. The terminals of the electronic component 30 according to the present embodiment can be classified into those that are to be electrically connected to the conductive member 20 and those that are to be electrically connected to the conductive pattern 101 provided on the substrate 10. Below, terminals that are to be electrically connected to the conductive member 20 may be referred to as "first terminals", and a terminal to be electrically connected to the conductive pattern 101 provided on the substrate 10 may be referred to as a "second terminal". Examples of the electronic component 30 include a transistor (FET). In this case, a drain terminal 32 and a source terminal 33 correspond to the first terminals, and a gate terminal 34 corresponds to the second terminal. Note that, below, the circuit structure 1 is described using a transistor (FET) as an example of the electronic component 30, but to facilitate comprehension of the description, it is assumed that the transistor has one drain terminal 32, one source terminal 33, and one gate terminal 34. However, there does not necessarily have to be only one of each terminal. Also, an electronic component (element) other than a transistor may be mounted in the substrate 10.

The drain terminal 32 that is a first terminal is located on one side of the main portion 31. The source terminal 33 that is a first terminal is located on the other side (side opposite to the side on which the drain terminal 32 is located) of the main portion 31. The gate terminal 34 that is the second terminal is located on the same side as the source terminal 33. The terminals are located on the lower side of the main portion 31. Specifically, the bottom face of the main portion 31 is a face where portions of the terminals are exposed.

In order to prevent the drain terminal 32 and the source terminal 33 from short circuiting, the conductive member 20 is divided into a portion (hereinafter also referred to as "first portion 21") to which the drain terminal 32 is connected, and a portion (hereinafter also referred to as "second portion 22") to which the source terminal 33 is connected. An opening 11 through which the electronic component 30 can pass is formed in the substrate 10. The electronic component 30 (main portion 31) according to the present embodiment is mounted on the conductive member 20 via the opening 11. The drain terminal 32 is located on one side of the main portion 31 and the source terminal 33 is located on the other side of the main portion 31, and therefore the electronic component 30 (main portion 31) is mounted on the conductive member 20 straddling the first portion 21 and the second portion 22 of the conductive member 20 (such that the space between the first portion 21 and the second portion 22 is located between the drain terminal 32, the source terminal 33, and the gate terminal 34). Then, using soldering or the like, the drain terminal 32 is connected to the first portion 21 and the source terminal 33 is connected to the second portion 22. The connection structure between the conductive member 20 and the drain terminal 32 or the source terminal 33 may take any form, and thus a description thereof has been omitted.

The gate terminal 34 is located on the same side as the source terminal 33 (the other side of the main portion 31). In the present embodiment, the second portion 22 of the conductive member 20 has a shape from which a portion has been cut out, where the cut out portion (hereinafter also referred to as "cut out portion 221") overlaps the gate terminal 34 in the height direction. Specifically, the first portion 21 and the second portion 22 are portions positioned with side edges thereof facing each other and being substantially parallel, but a portion of the second portion 22 is cut out (concave shape in plan view) and is distanced from the first portion 21, and the cut out portion and the gate terminal 34 overlap each other. In other words, the conductive member 20 (second portion 22) has a shape in which the gate terminal 34 is not overlapped thereby in the height direction, and the gate terminal 34 is not covered by the conductive member 20 but is exposed (see FIGS. 2 and 3 etc.). Note that, in the present embodiment, the conductive member 20 has a shape in which the entirety of the gate terminal 34 is not overlapped, but it is also possible to employ a shape where a portion of the gate terminal 34 is overlapped and the other portion is not overlapped. As described below, the gate terminal 34 is electrically connected to a first terminal connecting portion 12, and thus it is sufficient that a structure is employed where at least the terminal connecting portion 12 side of the gate terminal 34 is not overlapped by the conductive member 20. Note that, if such a configuration is employed, a portion of the gate terminal 34 and the conductive member 20 (second portion 22) that overlaps the same are to be insulated from each other to avoid short-circuiting.

Figure 3:
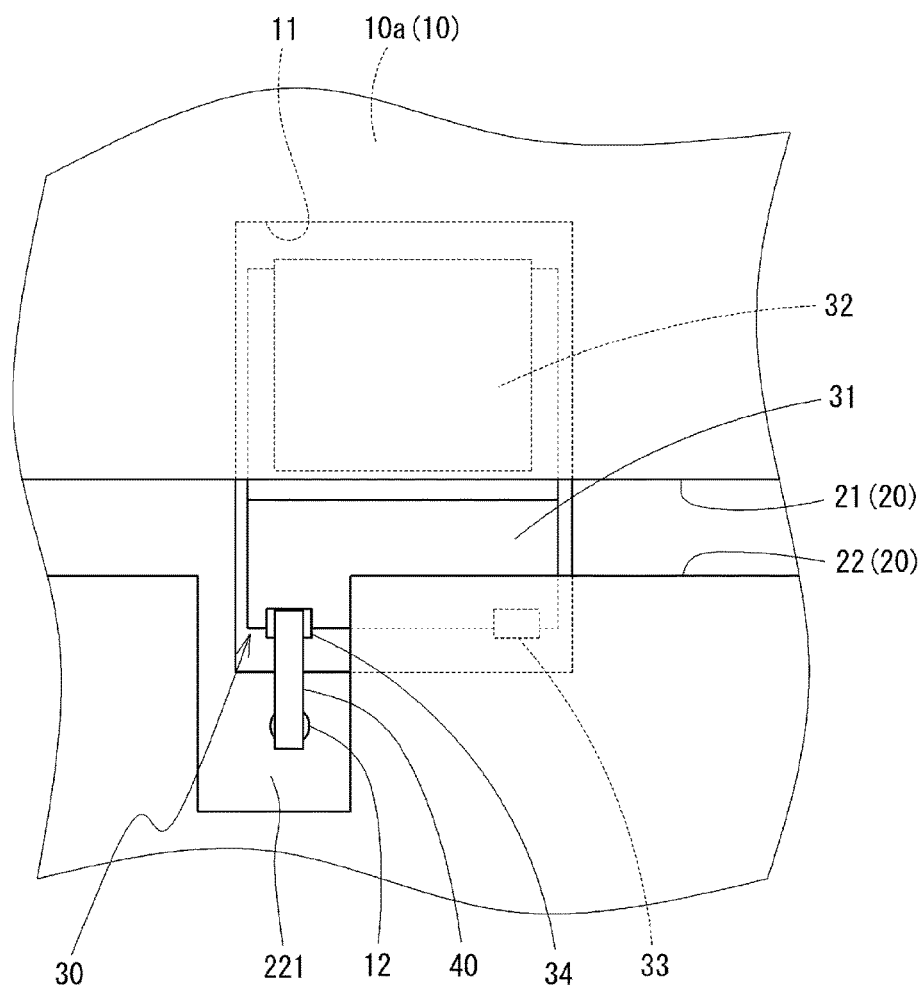
FIG. 3 is a bottom view of the portion of the circuit structure where the electronic component is mounted (seen from conductive member side).
Figure 4:
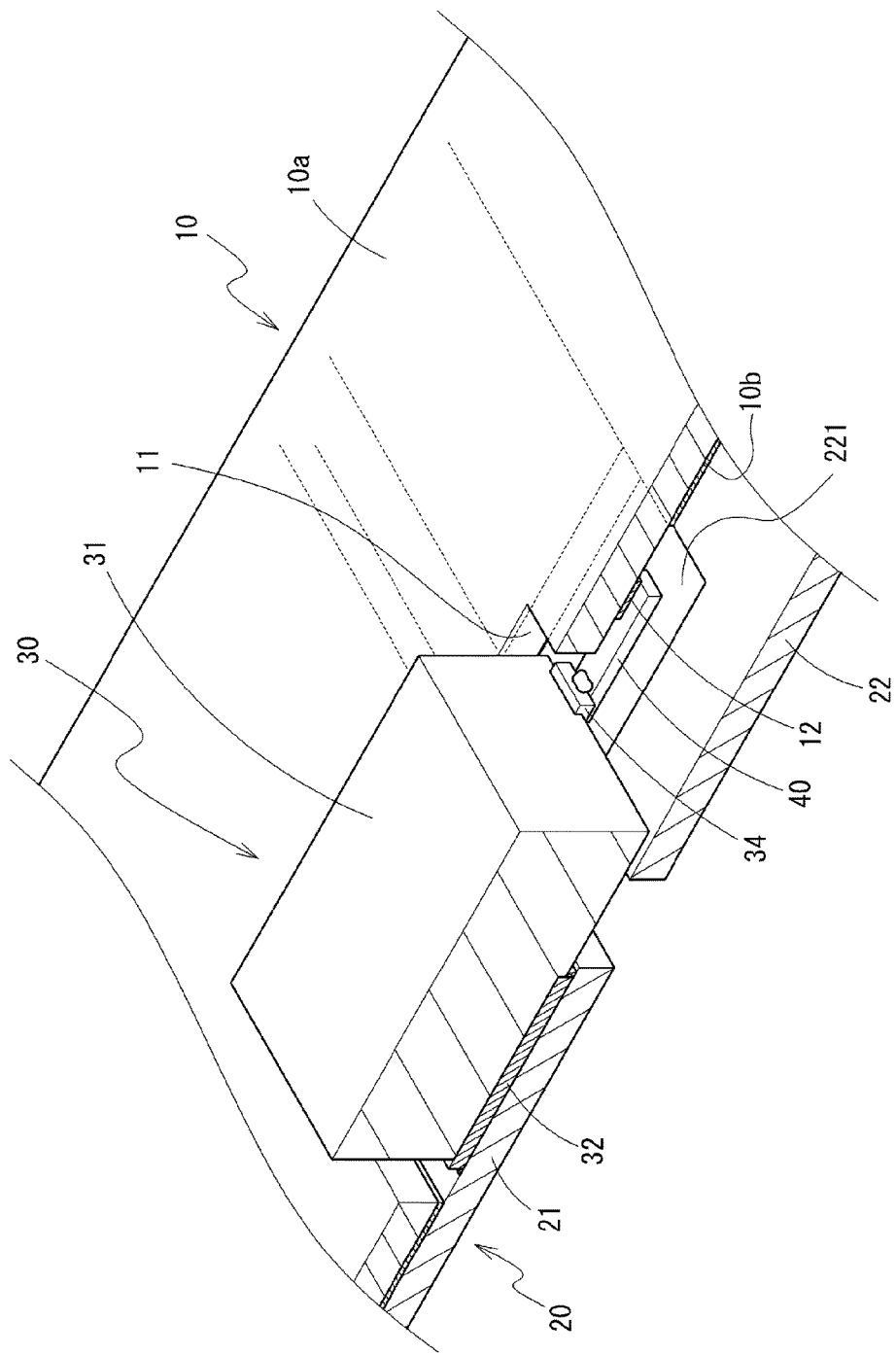
FIG. 4 is a perspective view for illustrating a connection structure interposed by a first lead member (partial cross-sectional view).
Figure 5:
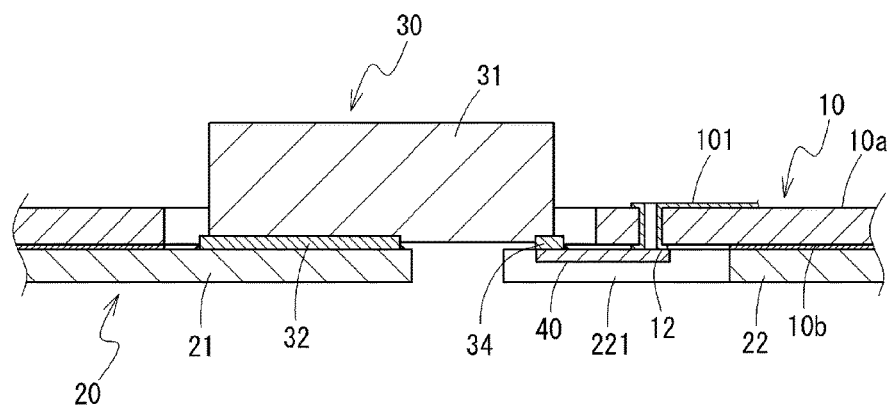
FIG. 5 is a cross-sectional view of the portion of the circuit structure where the electronic component is mounted (a cross-sectional view taken along a plane passing through a second terminal and the first lead member).

Also, the first terminal connecting portion 12 (the "first" in "first terminal connecting portion" is nothing more than a formality to differentiate from a later-described "second terminal connecting portion 13") that is made of a conductive material is provided on the other face 10b of the substrate 10 (see FIGS. 3 to 5 etc.). The first terminal connecting portion 12 is electrically connected to the conductive pattern 101 provided on the one face 10a of the substrate 10. The connection structure between the first terminal connecting portion 12 and the conductive pattern 101 may take any form. For example, the first terminal connecting portion 12 and the conductive pattern 101 may be connected by a conductive member that has been passed through a through-hole piercing the substrate 10.

The first terminal connecting portion 12 according to the present embodiment is overlapped in the height direction by the cut out portion 221 formed in the second portion 22 of the conductive member 20. In other words, in the height direction, the conductive member 20 (second portion 22) has a shape in which the gate terminal 34 as well as the first terminal connecting portion 12 are not overlapped thereby. Accordingly, the first terminal connecting portion 12 is not covered by the conductive member 20 and is exposed (see FIG. 3 etc.). In the present embodiment, the gate terminal 34 and the first terminal connecting portion 12 are lined up in a direction that runs along another edge of the main portion 31, and there is no member interposed between the gate terminal 34 and first terminal connecting portion 12. In other words, the conductive member 20 (second portion 22) is not present between the gate terminal 34 and the first terminal connecting portion 12.

In the present embodiment, the gate terminal 34 and the first terminal connecting portion 12 are connected by the first lead member 40 (the "first" in "first lead member" is nothing more than a formality to differentiate from a later-described "second lead member") that is made of a conductive material (see FIGS. 3 to 5 etc.). In other words, the gate terminal 34 and the first terminal connecting portion 12 are electrically connected to each other by the first lead member 40. Furthermore, the first terminal connecting portion 12 and the conductive pattern 101 (circuit) formed on the one face 10a of the substrate 10 are electrically connected to each other, and therefore the gate terminal 34 is electrically connected to the conductive pattern 101 provided on the one face 10a of the substrate 10 via the first terminal connecting portion 12.

In this way, the conductive member 20 has a shape in which the gate terminal 34 and the first terminal connecting portion 12 are not overlapped thereby and is not present between the gate terminal 34 and the first terminal connecting portion 12, and therefore, on the side of the other face 10b of the substrate 10, the terminal 34 and the first terminal connecting portion 12 can be electrically connected to each other by providing the first lead member 40 so as to span the two in this state (one end of the first lead member 40 is connected to the gate terminal 34 and the other end is connected to the first terminal connecting portion 12). So-called wire bonding or the like is an example of a method to connect the first lead member 40. The gate terminal 34 and the first terminal connecting portion 12 may also be electrically connected to each other by applying a conductive member such as a solder or the like so as to span the two (a solder or the like may itself function as the first lead member 40).

Below, while portions of the description above will be repeated, a favorable method of producing the circuit structure 1 according to the present embodiment will be described.

First, the conductive member 20 in which the cut out portion 221 is formed is joined to the other face 10b of the substrate 10 on which the conductive pattern 101, the opening 11 for mounting the electronic component 30 on the conductive member 20, and the first terminal connecting portion 12 electrically connected to the conductive pattern 101 are formed (first step). Accordingly, a set of substrate 10/conductive member 20 is obtained. The joining material that joins the substrate and the conductive member 20 is a material that insulates the two from each other. Note that, when performing the first step, the first portion 21 and the second portion 22 of the conductive member 20 are joined by an excess length portion. The excess length portion is cut off after this step. There is no particular limitation to the timing at which the cutting off is performed.

Next, various elements such as the electronic component 30 are mounted to the set of substrate 10/conductive member 20 obtained in the first step (second step). The mounting method (such as soldering) may take any form. In this step, the drain terminal 32 of the above-described electronic component 30 (transistor) is connected to the first portion 21 of the conductive member 20 and the source terminal 33 is connected to the second portion 22 of the conductive member 20. In other words, the first terminals of the electronic component 30 are connected to the conductive member 20.

With this step, it can be said that the electronic component 30 (main portion 31) is mechanically joined to the conductive member 20 (set of substrate 10/conductive member 20).

Next, the gate terminal 34 (second terminal) of the electronic component 30 and the first terminal connecting portion 12 are electrically connected to each other by using the first lead member 40 (third step). Accordingly, the gate terminal 34 is electrically connected to the conductive pattern 101, and the circuit structure 1 according to the present embodiment is obtained. Steps other than the first to third steps described here may include a step of joining a heat dissipating member (in cases where the circuit structure is to include a heat dissipating member) to the conductive member 20, for example.

As described above, the circuit structure 1 according to the present embodiment has a shape in which the conductive member 20 does not overlap at least a portion of the gate terminal 34 (second terminal) of the electronic component 30, and does not overlap the first terminal connecting portion 12. Accordingly, the gate terminal 34 can be electrically connected to the first terminal connecting portion 12 from the conductive member 20 side (from below), and the second terminal and the conductive pattern 101 provided on the substrate 10 can be electrically connected to each other (connection work can be performed) with ease. There is no need to absorb a step difference between the one face 10a of the substrate 10 and the face of the conductive member 20 on the substrate 10 side by e.g. bending terminals as was conventionally performed. Also, connection is not difficult even if the terminals are short.

Figure 6:
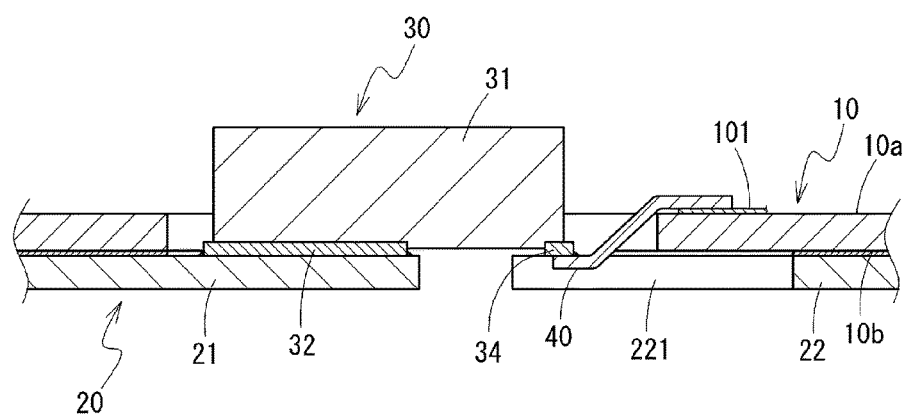
FIG. 6 is a cross-sectional view of a circuit structure according to a first modification.

Configurations such as those described below are conceivable modifications of the above-described circuit structure 1. The modification (first modification) shown in FIG. 6 is different from the circuit structure 1 according to the above-described embodiment in that no first terminal connecting portion 12 is provided on the other face 10b of the substrate 10. In other words, for example, a structure may also be employed where the conductive pattern 101, at which a portion (land) to where the gate terminal 34 is to be connected is located, is formed on the side edge of the one face 10a of the substrate 10 on the gate terminal 34 side (second terminal side) thereof, and the gate terminal 34 and the conductive pattern 101 are connected via the first lead member 40 or are directly connected to each other. Even if such a structure is employed, at least a portion of the gate terminal 34 is not overlapped by the conductive member 20 (second portion 22), and thus can be electrically connected to the conductive pattern 101 with ease by using the portion thereof not overlapped by the conductive member 20. In other words, if a first terminal connecting portion 12 such as that described above is provided on the other face 10b of the substrate 10, the gate terminal 34 and the conductive pattern 101 can be electrically connected to each other with ease, but even if such a first terminal connecting portion 12 is not provided, the more the conductive member 20 is not covered by the gate terminal 34 and is exposed, the easier it is to electrically connect the gate terminal 34 and the conductive pattern 101 (circuit) provided on the substrate 10 than it has previously been.

Note that, the configuration shown in FIG. 6 can also be regarded as a configuration in which the first terminal connecting portion 12 to which the gate terminal 34 is electrically connected is provided on the one face 10a of the substrate 10 (and the portion (land) to which the gate terminal 34 is to be connected can be regarded as the first terminal connecting portion 12). A configuration may also be employed in which the first terminal connecting portion 12 is provided on an end face (side face) of the substrate 10, on the gate terminal 34 side.

Figure 7:
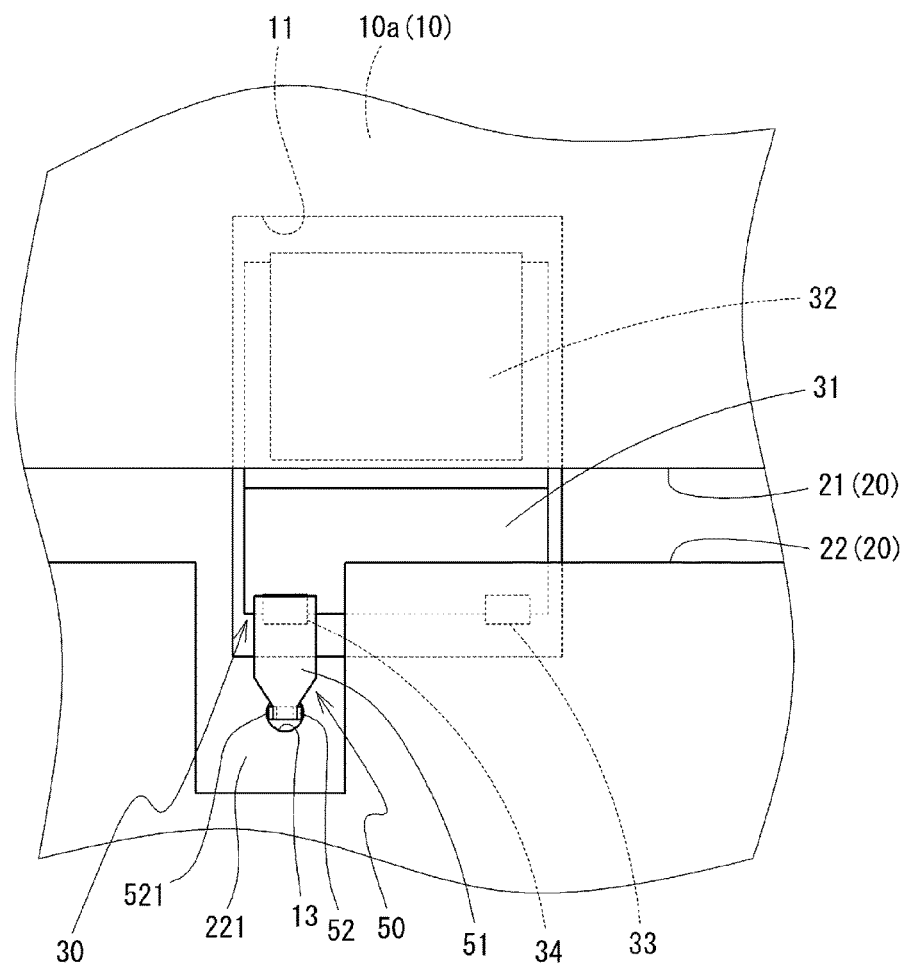
FIG. 7 is a bottom view of a portion of a circuit structure according to a second modification where an electronic component is mounted (seen from conductive member side).
Figure 8:
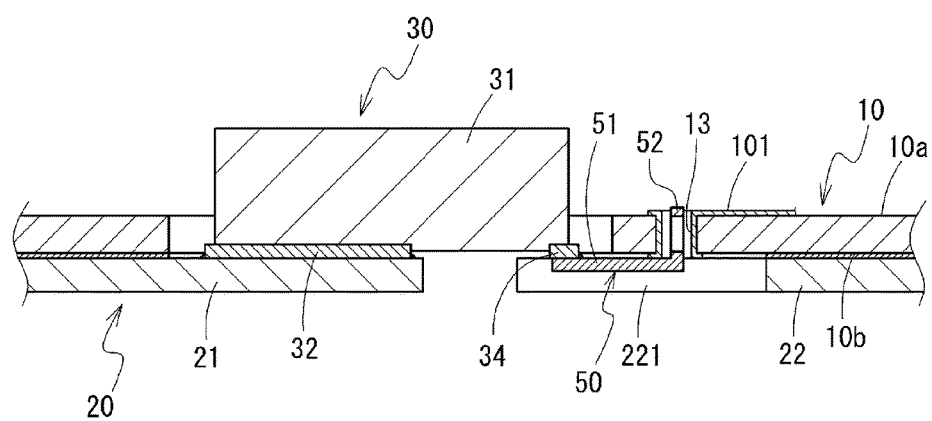
FIG. 8 is a cross-sectional view of a circuit structure according to the second modification.

Also, a configuration such as that shown in FIG. 7 and FIG. 8 is conceivable as another modification (second modification). In this modification, a second terminal connecting portion 13 is provided between the one face 10a and the other face 10b of the substrate 10 ("second" in the "second terminal connecting portion 13" is nothing more than a formality to differentiate from the above-described first terminal connecting portion 12). Specifically, the second terminal connecting portion 13 that is electrically connected to the conductive pattern 101 provided on the one face 10a of the substrate 10 is provided along the inner circumferential surface of a through-hole formed in the substrate 10. For example, the second terminal connecting portion 13 can be constructed by fixing a through-hole to the substrate 10. In other words, the cylindrical portion of the through-hole can be the second terminal connecting portion 13. Note that an ordinary through-hole is used for electrically connecting the one face 10a and the other face 10b of the substrate 10, but there is no need for it to extend all the way to the other face 10b. In other words, a structure may be employed in which the conductive pattern 101 provided on the one face 10a extends at least to the inner circumferential surface of the through-hole formed in the substrate 10.

The second terminal connecting portion 13 is provided so as not to be overlapped by the conductive member 20. In other words, the second terminal connecting portion 13 is overlapped by the cut out portion 221 formed in the conductive member 20. That is to say, the opening of the through-hole formed by the second terminal connecting portion 13 on the other face 10b side is not covered by the conductive member 20 and is exposed.

In this modification, the gate terminal 34 and the second terminal connecting portion 13 are connected to each other by using a second lead member 50 ("second" in "second lead member 50" is nothing more than a formality to differentiate from the above-described "first lead member 40") that is made of a conductive material. In other words, the gate terminal 34 and the second terminal connecting portion 13 are electrically connected to each other by the second lead member 50. Furthermore, the second terminal connecting portion 13 and the conductive pattern 101 (circuit) provided on the one face 10a of the substrate 10 are electrically connected to each other, and thus the gate terminal 34 is electrically connected to the conductive pattern 101 provided on the one face 10a of the substrate 10, via the second terminal connecting portion 13.

Figure 9:
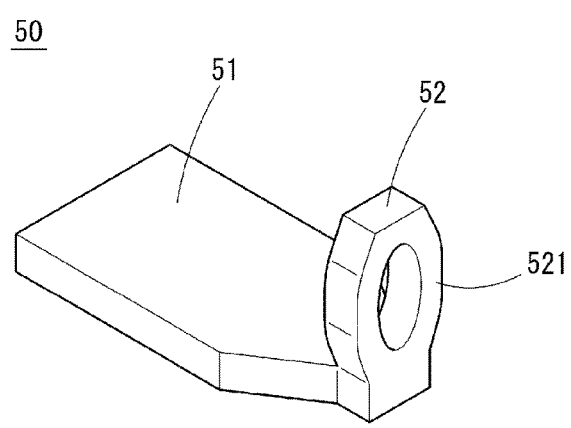
FIG. 9 is an external view of a lead member used in the circuit structure according to the second modification.

The second lead member 50 (see FIG. 9 for details) has a contact terminal portion 521 that comes into contact with the second terminal connecting portion 13. The contact terminal portion 521 is provided on one side of the second lead member 50. Specifically, the second lead member 50 is substantially L-shaped and includes a portion that runs in the surface direction (hereinafter, referred to as "base end side portion 51") and a portion that runs in the height direction (hereinafter, referred to as "leading end side portion 52"), and the contact terminal portion 521 is formed in the leading end side portion 52. The contact terminal portion 521 in this modification is a portion that is substantially O-shaped and bulges outward. The width of the portion bulging outward is set to be slightly larger than the inner diameter of the through-hole (second terminal connection portion 13). Accordingly, when the leading end side portion 52 is inserted into the through-hole, the contact terminal portion 521 undergoes elastic deformation as a result of being pressed by the second terminal connecting portion 13. In other words, due to the elasticity of the contact terminal portion 521, the contact terminal portion 521 enters a state of pressing against the second terminal connecting portion 13.

The base end side portion 51 of the second lead member 50 is connected to the gate terminal 34 through soldering or the like. Accordingly, the gate terminal 34 and the second terminal connecting portion 13 enter a state of being electrically connected to each other.

In this way, the gate terminal 34 and the conductive pattern 101 can be electrically connected to each other via the second terminal connecting portion 13 provided between the one face 10a and the other face 10b of the substrate 10. The second terminal connecting portion 13 can be a portion formed along the inner circumferential surface of the through-hole in the substrate 10. Work to achieve electrical connection can be performed with ease by using the second lead member 50 that has the contact terminal portion 521, the contact terminal portion 521 coming into contact with the second terminal connecting portion 13 at a predetermined pressure force due to having been inserted into the through-hole.

Figure 10:
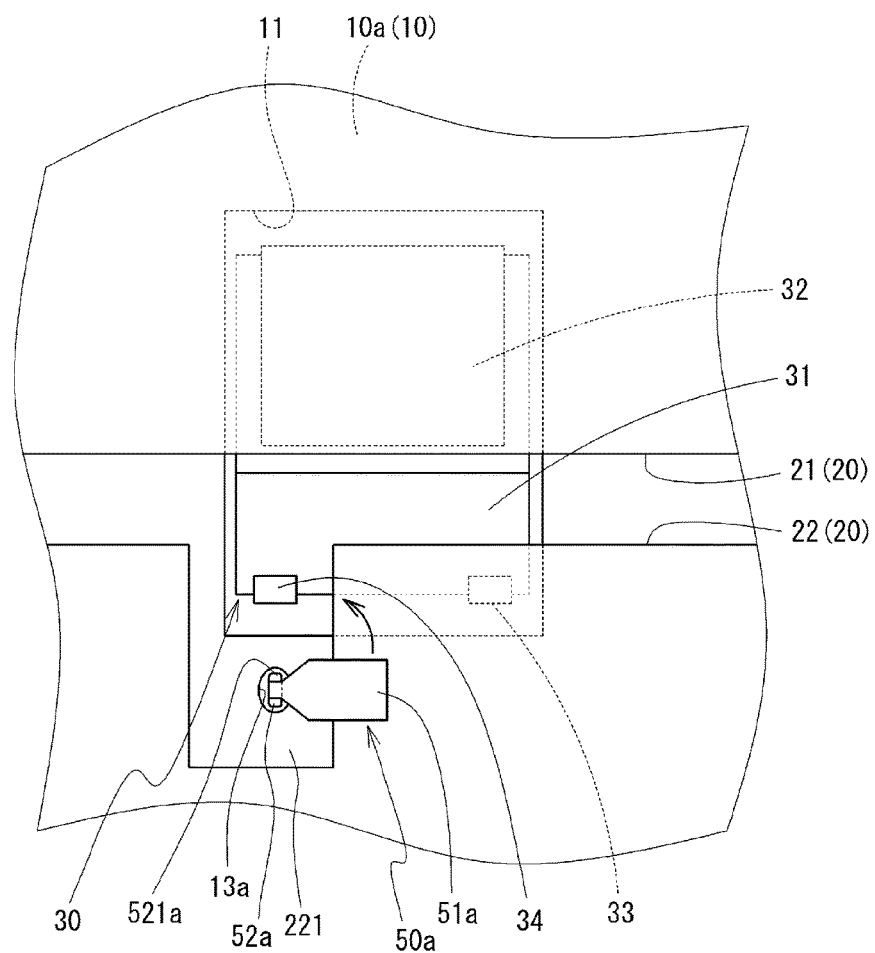
FIG. 10 is a bottom view of a portion of a circuit structure according to a third modification where an electronic component is mounted (seen from conductive member side), and shows a state where a leading end side portion of a lead member has been inserted.
Figure 11:
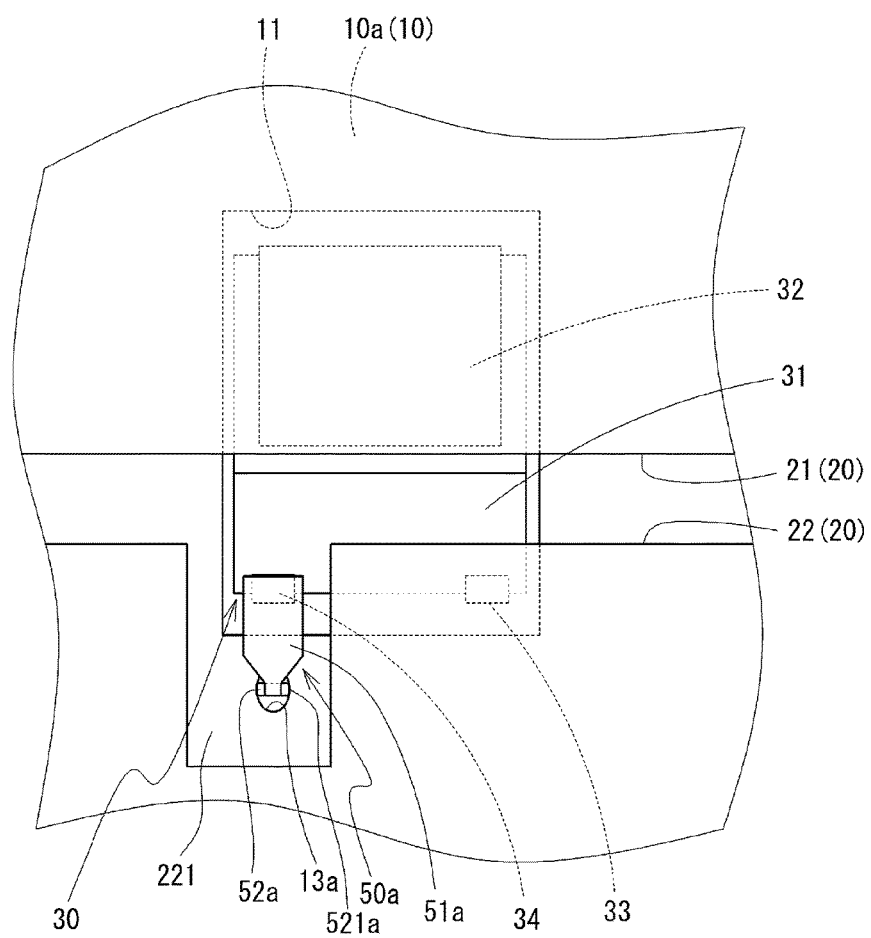
FIG. 11 is a bottom view of the portion of the circuit structure according to the third modification where the electronic component is mounted (seen from conductive member side), and shows a state where the leading end side portion of the lead member has been inserted and rotated to bring a terminal contact portion into contact with a terminal connecting portion.

The electrical connection structure between the second terminal connecting portion and the second lead member can be as described below (third modification). As shown in FIG. 10 and FIG. 11, a second terminal connecting portion 13a (inner circumferential surface of the through-hole) has a shape in which the distance from the central axial line thereof is not constant. For example, a shape in which the size in a certain direction is relatively large (hereinafter, this portion is referred to as "long portion"), and the size in a direction orthogonal to the certain direction is relatively small (hereinafter, referred to as "short portion"). In other words, the cross-sectional shape thereof is long and narrow. In this modification, the cross section has an elliptical shape.

Figure 12:
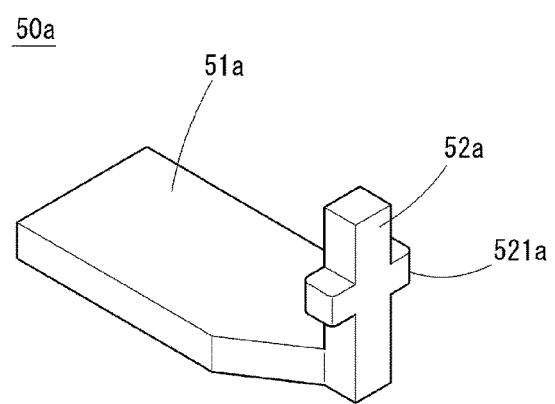
FIG. 12 is an external view of the lead member used in the circuit structure according to the third modification.

A contact terminal portion 521a provided on a second lead member 50a (see FIG. 12 for details) is a protrusion (a protrusion protruding orthogonal to the the longitudinal direction of a leading end side portion 52a) protruding from a leading end side portion 52a, and the length thereof is shorter than the long portion of the second terminal connecting portion 13a, and is longer than the short portion of the second terminal connecting portion 13a.

The second lead member 50a is electrically connected to the second terminal connecting portion 13a in the following manner. The contact terminal portion 521a (leading end side portion 52a) of the second lead member 50a is inserted into the second terminal connecting portion 13a (through-hole). At this time, the longitudinal direction of the contact terminal portion 521a and the longitudinal portion of the second terminal connecting portion 13a coincide with each other. The length of the contact terminal portion 521a is shorter than the length of the long portion of the second terminal connecting portion 13a, and thus the contact terminal portion 521a is smoothly inserted into the second terminal connecting portion 13a (through-hole) (see FIG. 10).

After the contact terminal portion 521a has been inserted into the second terminal connecting portion 13a (through-hole), the second lead member 50a is pivoted centered around the leading end portion 52a. In doing so, the length of the contact terminal portion 521a is shorter than the length of the short portion of the second terminal connecting portion 13a, and thus the contact terminal portion 521a enters a state of being pressed in the short portion of the second terminal connecting portion 13a. In other words, the second lead member 50a and the second terminal connecting portion 13a enter a state of being electrically connected to each other. Also, when the second lead member 50a is pivoted in this way, the base end side portion 51a is moved toward the gate terminal 34, and thus the base end side portion 51a and the gate terminal 34 achieve a positional relation in which connection is facilitated (soldering is easy to perform, for example) (see FIG. 11).

Note that the second modification and third modification described above show electrical connection structures of the gate terminal 34 and the conductive pattern 101 that are different from the circuit structure 1 in the embodiment described above, but a circuit structure may be one in which the connection structure described in the second modification or the third modification and the connection structure described in the above-described embodiment are combined (co-exist).

The embodiment of the present invention has thus been described in detail, but the present invention is not to be limited to the above-described embodiment in any way, and various modifications are possible provided they are within the spirit of the present invention.

For example, the electric part 30 (transistor) in the above-described embodiment was described as having the main portion 31 being mounted on the conductive member 20, but similar technical concepts can be applied to being mounted on the substrate 10. However, a structure where the main portion 31 is mounted on the conductive member 20 allows for the work of electrically connecting the first terminals (drain terminal 32 and source terminal 33), excluding the second terminal (gate terminal 34) which is to be electrically connected to the conductive pattern 101 provided on the substrate 10, to the conductive member 20 to be performed with ease, and the reliability of the electrical connection between the first terminals and the conductive member 20 is improved. Also, if the main portion 31 is mounted on the conductive member 20, the difference between the position of the second terminal in the height direction and the position of the other face 10b of the substrate 10 in the height direction is reduced, and therefore, if the first terminal connecting portion 12 or the second terminal connecting portion 13 (13a) is provided on the other face 10b of the substrate 10, there are advantages in that the work of connecting the second terminal and the first terminal connecting portion 12, or the work of connecting the second terminal and the second terminal connecting portion 13 (13a) can be performed with ease.

Also, in the above-described embodiment, it was described that at least a portion of the second terminal (gate terminal 34) is not overlapped by the conductive member 20 due to the cut out portion 221 (second portion 22) being formed in the conductive member 20, but a configuration (shape) in which at least a portion of the second terminal is not overlapped by the conductive member 20 is not limited to one in which the cut out portion 221 is formed. A structure may be employed in which at least a portion of the second terminal is not overlapped by the conductive member 20 due to a through-hole that is formed in the conductive member 20. This is the same for methods employed where the first terminal connecting portion 12 or the second terminal connecting portion 13 (13a) is not overlapped by the conductive member 20.

Also, in the above-described embodiment, a transistor was described as an example of the electronic component 30, but the electronic component 30 is not limited to being a transistor, provided that a portion of the plurality of terminals are electrically connected to the conductive member 20 and the other terminals are electrically connected to the conductive pattern 101 provided on the substrate 10.

The invention claimed is:

1. A circuit structure comprising:
a substrate having a first face opposite of a second face, a conductive pattern having a first portion and a second portion, the first portion being disposed on the first face and the second portion being disposed on the second face;
a conductive member fixed to the second face of the substrate, the conductive member having a cut out portion; and
an electronic component that has a main portion, a first terminal electrically connected to the conductive member, a second terminal, and a first lead member, the first lead member electrically connecting the second terminal to the second portion of the conductive pattern, the second terminal and at least a portion of the first lead member are disposed within the cut out portion, and wherein a portion of the main portion overlaps the conductive member.

2. The circuit structure according to claim 1, wherein a first terminal connecting portion is provided on the second face of the substrate and disposed in the cut out portion of the conductive member, and
the second terminal of the electronic component is electrically connected to the conductive pattern via the first terminal connecting portion.

3. The circuit structure according to claim 2 wherein the first lead member electrically connects the second terminal of the electronic component and the first terminal connecting portion.

4. The circuit structure according to claim 1,
wherein a second terminal connecting portion is provided between the first face and the second face of the substrate, and is disposed within the cut out portion of the conductive member, and
the second terminal of the electronic component is electrically connected to the conductive pattern via the second terminal connecting portion.

5. The circuit structure according to claim 4, wherein the second terminal connecting portion is formed along an inner circumferential surface of a through-hole formed in the substrate, and
wherein the first lead member has, on one side thereof, a contact terminal portion that is inserted into the through-hole and comes into contact with the second terminal connecting portion.

6. The circuit structure according to claim 1,
wherein an opening is formed in the substrate, and the electronic component is mounted on the conductive member through the opening.

* * * * *